United States Patent
Kim et al.

(10) Patent No.: US 11,133,063 B1
(45) Date of Patent: Sep. 28, 2021

(54) SUPPRESSING UNDESIRED PROGRAMMING AT HALF-SELECTED DEVICES IN A CROSSPOINT ARRAY OF 3-TERMINAL RESISTIVE MEMORY

(71) Applicant: International Business Machines Corporation, Armonk, NY (US)

(72) Inventors: Seyoung Kim, Pohang (KR); Oguzhan Murat Onen, Boston, MA (US); Tayfun Gokmen, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/907,437

(22) Filed: Jun. 22, 2020

(51) Int. Cl.
*G11C 16/04* (2006.01)
*G11C 16/10* (2006.01)
*G11C 13/00* (2006.01)
*G06N 3/04* (2006.01)
*G06N 3/063* (2006.01)

(52) U.S. Cl.
CPC ......... *G11C 13/004* (2013.01); *G06N 3/0472* (2013.01); *G06N 3/063* (2013.01); *G11C 13/0028* (2013.01); *G11C 13/0069* (2013.01)

(58) Field of Classification Search
CPC .............. H01L 45/1206; H01L 45/146; H01L 45/1273; H01L 45/1675; G11C 11/54; G11C 13/0069; G11C 13/003; G11C 13/004; G11C 5/06; G11C 16/04; G11C 16/06; G11C 16/10; G11C 16/044
See application file for complete search history.

(56) References Cited

U.S. PATENT DOCUMENTS

| 7,167,026 | B2 | 1/2007 | Bertin et al. | |
| 8,363,443 | B2* | 1/2013 | Chevallier | G11C 11/21 365/51 |
| 9,514,818 | B1 | 12/2016 | Roizin et al. | |
| 9,767,407 | B2 | 9/2017 | Cho et al. | |
| 9,852,790 | B1* | 12/2017 | Gokmen | G11C 13/0007 |
| 10,002,646 | B2 | 6/2018 | Siau et al. | |

(Continued)

OTHER PUBLICATIONS

Gokmen et al., "Training LSTM Networks With Resistive Cross-Point Devices," Frontiers in Neuroscience, vol. 12, Article 745, Oct. 2018, pp. 1-10.

(Continued)

*Primary Examiner* — Hien N Nguyen
(74) *Attorney, Agent, or Firm* — Cantor Colburn LLP; Randall Bluestone (57) ABSTRACT

Aspects of the invention include performing a stochastic update for a crossbar array by generating a set of stochastic pulses for a crossbar array, the crossbar array including a plurality of row wires and a plurality of column wires, the plurality of row wires including a first row wire and the plurality of column wires including a first column wire, wherein a three terminal device is coupled to the first row wire and the first column wire at a crosspoint of the first row wire and the first column wire, and wherein a resistivity of the three terminal device is modified responsive to a coincidence of pulses from the set of stochastic pulses at the crosspoint of the first row and the first column, and wherein at least one terminal in the three terminal device is floating.

20 Claims, 5 Drawing Sheets

(56) References Cited

U.S. PATENT DOCUMENTS

| | | | |
|---|---|---|---|
| 10,381,074 B1* | 8/2019 | Kim | G06N 3/063 |
| 2015/0255157 A1* | 9/2015 | Ikeda | G11C 27/005 |
| | | | 365/185.23 |
| 2015/0278682 A1 | 10/2015 | Saxena | |
| 2017/0109626 A1 | 4/2017 | Gokmen et al. | |
| 2018/0277552 A1 | 9/2018 | Huang et al. | |
| 2018/0285721 A1 | 10/2018 | Lee | |
| 2018/0293487 A1* | 10/2018 | Copel | G06N 3/0635 |
| 2019/0180174 A1* | 6/2019 | Koswatta | G06N 3/08 |

OTHER PUBLICATIONS

Wenke et al., "Novel spiking neural network utilizing short-term and long-term dynamics of 3-terminal resistive crossbar arrays," 60th International Midwest Symposium on Circuits and Systems (MWSCAS), 2017, pp. 432-435.

* cited by examiner

FIG. 1 f(x) = f (INPUT 1 * CONNECTION STRENGTH 1 + INPUT 2 * CONNECTION STRENGTH 2)

$$i = g(s,v)v \quad \text{EQUATION [1]}$$

$$\frac{\partial q(t)}{\partial t} = f(s,v) \quad \text{EQUATION [2]}$$

SUPPRESSING UNDESIRED PROGRAMMING AT HALF-SELECTED DEVICES IN A CROSSPOINT ARRAY OF 3-TERMINAL RESISTIVE MEMORY

BACKGROUND

The present invention generally relates to resistive processing units, and more specifically, to suppressing undesired programming at half-selected devices in a cross point array of resistive memory devices.

"Machine learning" is used to broadly describe a primary function of electronic systems that learn from data. In machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. Crossbar arrays are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

SUMMARY

Embodiments of the present invention are directed to a computer-implemented method for suppressing undesired programming at half-selected devices in crosspoint arrays. A non-limiting example of the computer-implemented method includes operating a stochastic translator to generate a set of stochastic pulses for a crossbar array, the crossbar array including a plurality of row wires and a plurality of column wires, the plurality of row wires including a first row wire and the plurality of column wires including a first column wire, wherein a three terminal device is coupled to the first row wire and the first column wire at a crosspoint of the first row wire and the first column wire, and wherein a resistivity of the three terminal device is modified responsive to a coincidence of pulses from the set of stochastic pulses at the crosspoint of the first row and the first column.

Embodiments of the present invention are directed to a system for suppressing undesired programming at half-selected devices in crosspoint arrays. A non-limiting example of the system includes a memory having computer readable instructions, one or more processors for executing the computer readable instructions, the computer readable instructions controlling the one or more processors to perform operations including operating a stochastic translator to generate a set of stochastic pulses for a crossbar array, the crossbar array including a plurality of row wires and a plurality of column wires, the plurality of row wires including a first row wire and the plurality of column wires including a first column wire, wherein a three terminal device is coupled to the first row wire and the first column wire at a crosspoint of the first row wire and the first column wire, and wherein a resistivity of the three terminal device is modified responsive to a coincidence of pulses from the set of stochastic pulses at the crosspoint of the first row and the first column.

Embodiments of the present invention are directed to a computer program product for suppressing undesired programming at half-selected devices in crosspoint arrays. A non-limiting example of the computer program product includes operating a stochastic translator to generate a set of stochastic pulses for a crossbar array, the crossbar array including a plurality of row wires and a plurality of column wires, the plurality of row wires including a first row wire and the plurality of column wires including a first column wire, wherein a three terminal device is coupled to the first row wire and the first column wire at a crosspoint of the first row wire and the first column wire, and wherein a resistivity of the three terminal device is modified responsive to a coincidence of pulses from the set of stochastic pulses at the crosspoint of the first row and the first column.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Aspects of the present invention include novel configurations of programmable resistive crossbar devices and methods for programming the devices, which are referred to herein as resistive processing units (RPUs). A basic crossbar array (sometimes referred to herein as a "crosspoint array") configuration includes a set of conductive row wires and a set of conductive column wires formed to intersect the set of conductive row wires. The intersections between the two sets of wires are separated by so-called crossbar devices (i.e., RPUs). Typical RPUs include two-terminal devices having a non-linear switching characteristic. Aspects of the present invention provide for RPUs in a crossbar array having three terminals that allows for gate control at the extra terminal to control the behavior of the RPUs. The other two terminals in the three-terminal RPU are the source and drain terminals. The update cycles for these RPUs are controlled by a gate-channel voltage. This allows for update cycle connections of the RPUs to be with gate terminals connected to the crossbar row wires and source terminals to the crossbar column wires and the drain terminals are also connected to a separate row wire in the crossbar array. In this configuration, there are two row wires for every one column wire in the crossbar. Or, alternatively, gate terminals can be connected to the crossbar column wires and drain terminals connected to the crossbar row wires.

In one or more embodiments of the present invention, the unused terminal of the three-terminal device can be floated during the update cycle as the potential difference across gate-channel can be controlled with a gate and either end of the channel. In an array implementation, the floating can be maintained by a single pass-gate transistor at each row and column that is configured to fire when there is a pulse and is configured to cut the connection when no pulse is present. When floating is performed, as neither the drain nor source terminal are always floating during the update cycle, the devices are connected by their gates or sources. The programing of a device occurs when there is sufficient voltage drop across gate to channel such that a current flows to tune the conductance value of the device. In contrast, current flowing across the channel does not modify the voltage level because current cannot flow through the channel when all drains are floated during an update. When either the source-drain or the gate-drain (depending on the configuration of the crossbar array) are floated, the devices are unable to perform a sneak-path because current passes two gates in order to program both of them inadvertently. A sneak-paths refer to undesired paths for current, which are typically parallel to the intended path. The channel capacitance creates an exponential dependency between this current (Ig) and voltage (Vg) and therefore it is practically impossible to create sufficient voltage drop with floating gates. Accordingly, instead of grounding the line as performed in a regular stochastic update scheme, in some embodiments of the present invention the lines can be left floating. By floating the terminals connected to the lines, the method improves the update quality of the devices. Floating the terminals refers to not forcing the voltage on the terminal to a ground state during a stochastic update. In a typical two-terminal RPU scenario, the rows receive either a HIGH or GND signal during a stochastic update and the columns receive either a LOW or GND (i.e., HIGH=+1V, GND=0, LOW=−1V). In the three-terminal RPU crossbar array described herein, the drain is floated, and the gate is either HIGH or FLT and the source is either LOW or FLT. The improvement to the update quality of the devices occurs, for example, where devices are getting modified with a single pulse from either gate or source. Even though such an update is much smaller than the update taken with full voltage across, a smaller update is seen for half-bias condition due to the non-ideal thresholding. Floating the terminal removes these cases and the devices that do not get coinciding updates remain untouched. In addition, half bias pulses (e.g., a single pulse on a column or row) will not cause undesired programming at the RPU in this configuration.

The above described crossbar arrays can be utilized for artificial neural networks (ANNs). ANNs are a family of statistical learning models inspired by the biological neural networks of animals, and in particular the brain. ANNs can be used to estimate or approximate systems and functions that depend on a large number of inputs and are generally unknown. ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays or cross-wire arrays, are high density, low cost circuit architectures used to form a variety of electronic circuits and devices, including ANN architectures, neuromorphic microchips and ultra-high density nonvolatile memory. Crosspoint devices, in effect, function as the ANN's weighted connections between neurons. Nanoscale two-terminal devices, for example memristors having "ideal" conduction state switching characteristics, are often used as the crosspoint devices in order to emulate synaptic plasticity with high energy efficiency. The term "memristor" refers broadly to a passive two-terminal circuit element portion that changes its electrical resistance under sufficient electrical bias. The conduction state (e.g., resistance) of a memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

ANNs, also known as neuromorphic or synaptronic systems, are computational systems that can estimate or approximate other functions or systems, including, for example, biological neural systems, the human brain and brain-like functionality such as image recognition, speech recognition and the like. ANNs incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical).

Instead of utilizing the traditional digital model of manipulating zeros and ones, ANNs create connections between processing elements that are substantially the functional equivalent of the core system functionality that is being estimated or approximated. For example, IBM's Systems of Neuromorphic Adaptive Plastic Scalable Electronics (SyNapse) computer chip is the central component of an electronic neuromorphic machine that attempts to provide similar form, function and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Figure 1:
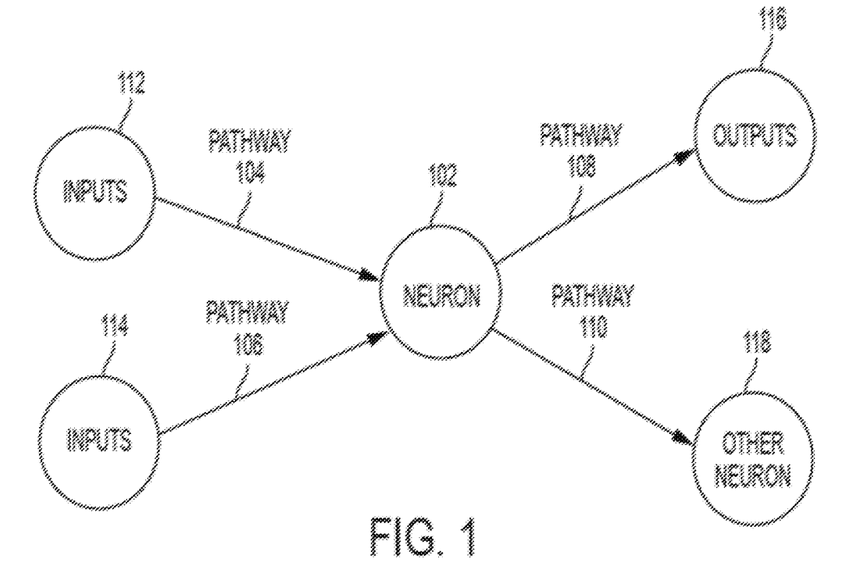
FIG. 1 depicts a simplified diagram of input and output connections of a biological neuron that can be modeled in accordance with aspects of the invention.
Figure 2:
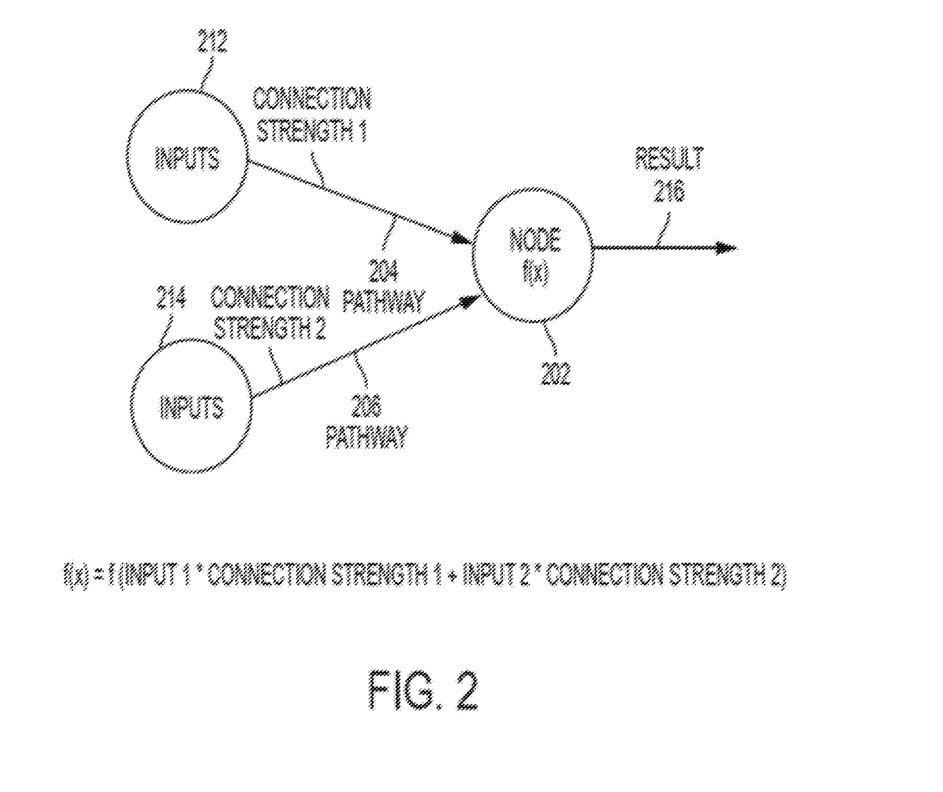
FIG. 2 depicts a known simplified model of the biological neuron shown in FIG. 1 capable of being utilized in connection with aspects of the invention.
Figure 3:
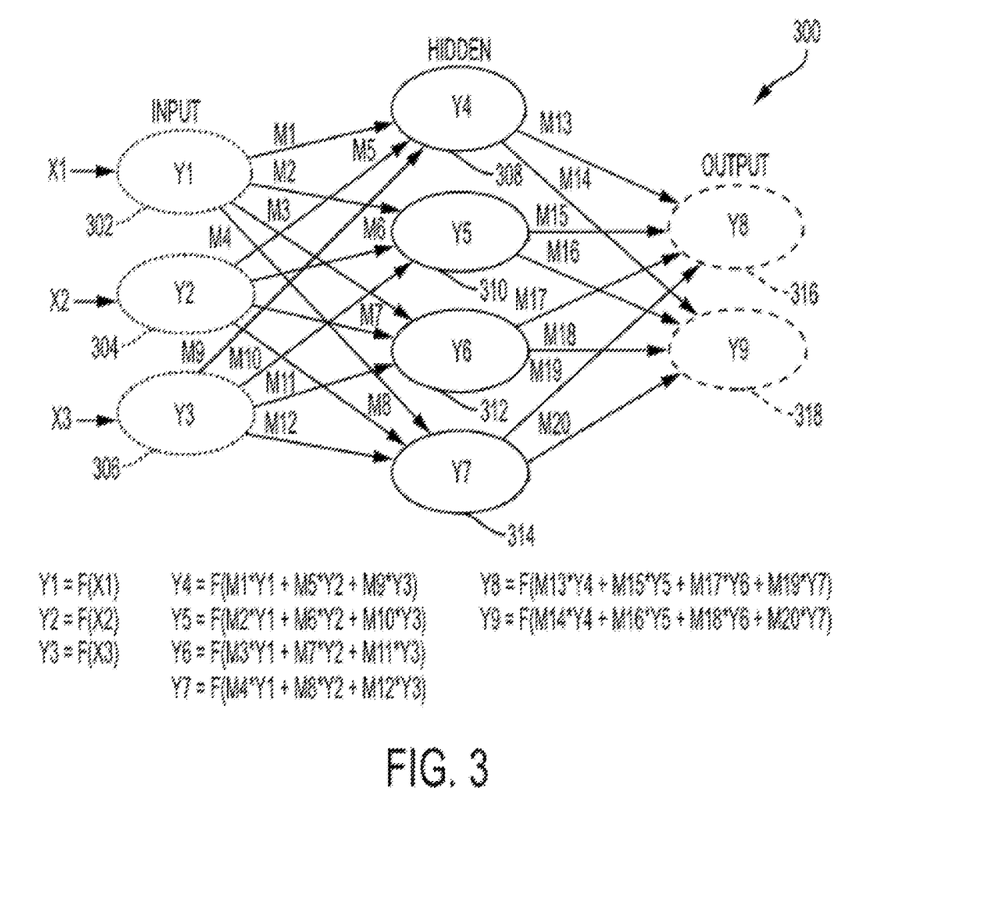
FIG. 3 depicts a known simplified model of an ANN incorporating the biological neuron model shown in FIG. 2.

As background, a general description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream outputs 116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present detailed description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. A typical design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning.

A two-terminal programmable resistive crosspoint component referred to herein as a resistive processing unit (RPU), provides local data storage functionality and local data processing functionality. In other words, when performing data processing, the value stored at each RPU is updated in parallel and locally, which eliminate the need to move relevant data in and out of a processor and a separate storage element. Additionally, the local data storage and local data processing provided by the two-terminal RPUs accelerate the ANN's ability to learn and implement algorithms such as backpropagating online neural network training, matrix inversion, matrix decomposition and the like. Accordingly, implementing a machine learning ANN architecture having the RPU enables the implementation of online machine learning capabilities that optimize the speed, efficiency and power consumption of learning. The RPU and resulting ANN architecture improve overall ANN performance and enable a broader range of practical ANN applications.

Prior to a more detailed description of RPUs, an overview of systolic arrays, stochastic computing and linear and non-linear memristor devices, which are relevant to the present invention, will now be provided. Systolic arrays are composed of parallel processing elements (PE) that attempt to accelerate the learning of certain highly used algorithms. Systolic arrays are often hard-wired for specific operations, such as "multiply and accumulate," to perform massively parallel integration, convolution, correlation, matrix multiplication or data sorting tasks.

Figure 4:
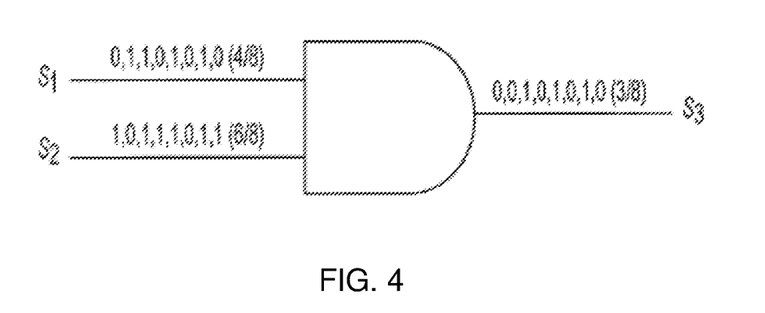
FIG. 4 depicts a simplified block diagram of a stochastic computing methodology capable of being used in one or more embodiments of the present invention.

Stochastic computing is a collection of techniques that represent continuous values by streams of random bits, wherein complex computations can be computed by simple bit-wise operations on the streams. Specifically, if there are two random and independent bit streams $S_1$, $S_2$ called stochastic numbers (i.e., a Bernoulli process), wherein the probability of a "one" in the first stream is p, and the probability of a "one" in the second stream is q, the logical AND of the two streams can be taken as shown in FIG. 4. The probability of a "one" in the output stream is pq. By observing enough output bits and measuring the frequency of "ones," it is possible to estimate pq to arbitrary accuracy. Because of the design simplicity of these so-called "multiply and accumulate" operations, which can be implemented with a few logic gates/transistors, stochastic computing is often used in the hardware design for neural networks.

However, in some stochastic techniques, the necessary weights for the computations are supplied to the systolic array from external locations, and updates to the weights are not performed by the array. This only addresses the acceleration of vector-matrix multiplication or matrix-matrix multiplication operations that are heavily used during neural network training. However, systolic arrays without local storage cannot perform the weight updates in parallel because the weights are stored at an external memory location. Accelerating the weight updates is necessary in order to accelerate the overall learning algorithm.

The term "memristor" is used to describe a passive two-terminal electrical component, wherein the resistance value of the device depends on the history of the voltages that have previously been applied to the device. The operation of a memristor is governed by Equations [1] and [2] shown in FIG. 5, wherein i is the current passing through the device, v is the voltage applied to the device, g is the conductance value of the device (which is the inverse of the resistance), s is the internal state variable of the device that controls the conductance value and f is the function that shows the time evolution of the internal state variable s. Memristor functionality can be utilized for the operation of resistive memory devices such as resistive random-access-memory (RRAM), phase change memory (PCM) and conductive-bridging random-access-memory (CBRAM). Because a memristor device remembers its history (i.e., the so-called "non-volatility property").

Figure 5:
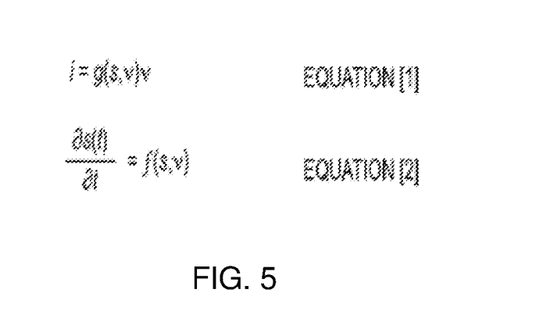
FIG. 5 depicts known equations that govern the operation of a passive, two-terminal memristor capable of being utilized in connection with aspects of the invention.

Some existing techniques are for the use of memristors for back-propagating neural network training hardware. However, this assumes an ideal memristor operation, wherein the change in resistance is linear with respect to the voltage applied to the device. This technique and design assumed that the function f(s,v) in Equation [2] of FIG. 5 is a simple function given by the relationship f(s,v)=v. Consider an architecture that is similar to a 2D systolic array as described above, wherein each crosspoint is implemented with an ideal memristor and a pair of transistors. The memristor is in effect used to store the weight value, and the pair of transistors is used to compute a local multiplication operation that is needed for the weight updates, wherein the result of the weight update modifies the memristor's conduction state. In effect, a four terminal device composed of a memristor and two transistors, which are used to make a 2D array of the 4 terminal devices in order to implement the back-propagation training of the neural network hardware.

When implementing the RPU device as a memristive system, it is important that the memristor is non-ideal with a non-linear switching characteristic. In an ideal memristor, the change in resistance is linearly proportional to the voltage applied to the ideal memristor device. Accordingly, as soon as an ideal memristor device experiences any voltage its resistance state changes. However, for described RPU devices implemented as non-ideal, non-linear memristive systems, there is a well-defined "SET" voltage, $V_{SET}$, (which is characteristics of the device), and the memristive RPU device would need to experience a voltage $V > V_{SET}$ in order to change its internal resistance state. However, the potential for undesired programmatic effects can exist in these RPUs when the voltage is equal to $V_{SET}$.

Figure 6:
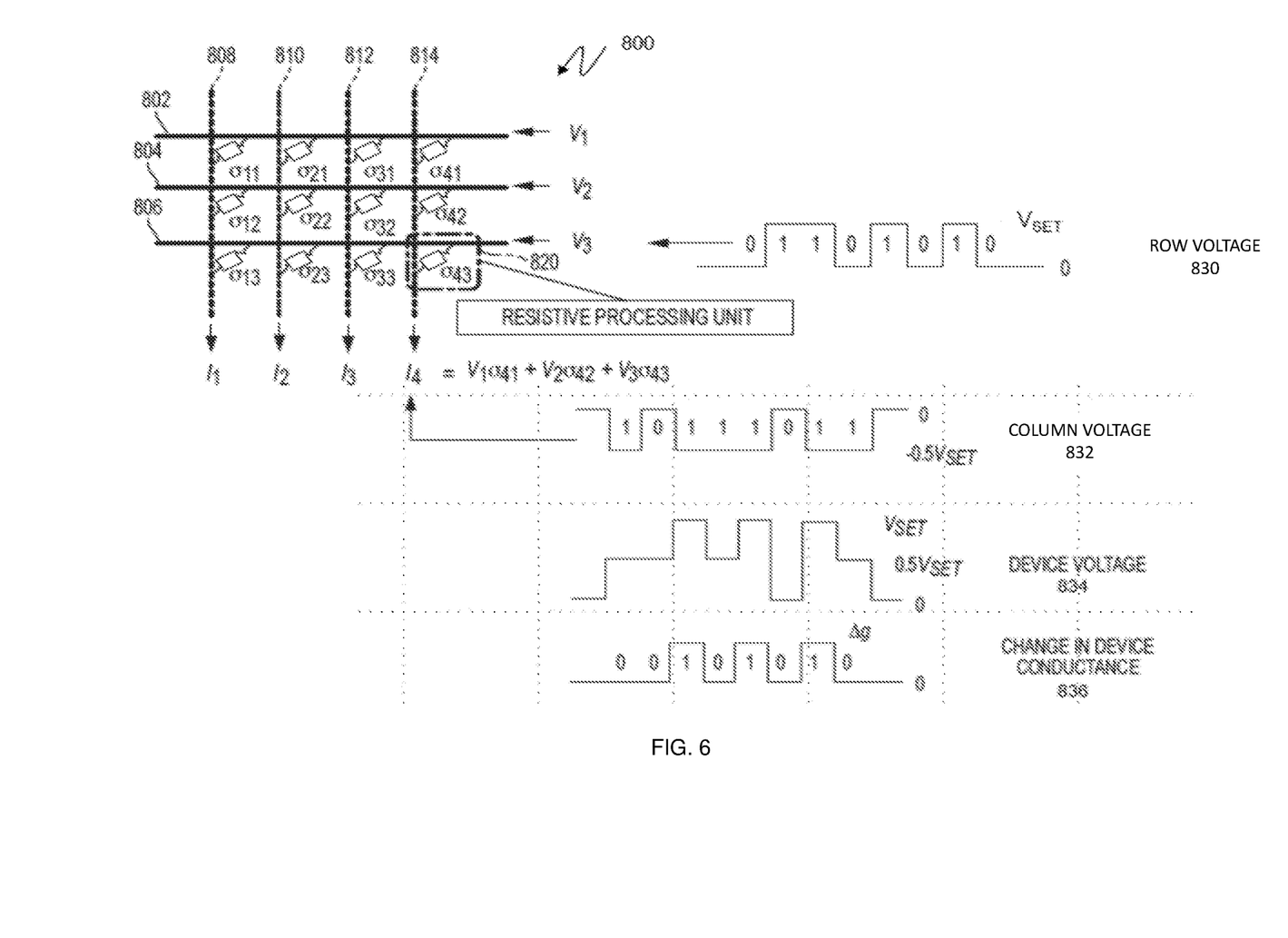
FIG. 6 depicts a cross bar array of two-terminal, non-linear RPU devices according to one or more embodiments of the present invention, along with voltage sequences illustrating the operation of the RPU.

FIG. 6 is a diagram of a two-dimensional (2D) crossbar array 800 that performs forward matrix multiplication, backward matrix multiplication and weight updates. Crossbar array 800 is formed from a set of conductive row wires 802, 804, 806 and a set of conductive column wires 808, 810, 812, 814 that intersect the set of conductive row wires 802, 804, 806. The intersections between the set of row wires and the set of column wires are separated by RPUs, which are shown in FIG. 6 as resistive elements each having its own adjustable/updateable resistive weight, depicted as $\sigma_{11}$, $\sigma_{21}$, $\sigma_{31}$, $\sigma_{41}$, $\sigma_{12}$, $\sigma_{22}$, $\sigma_{32}$, $\sigma_{42}$, $\sigma_{13}$, $\sigma_{23}$, $\sigma_{33}$ and $\sigma_{43}$, respectively. For ease of illustration, only one RPU 820 is labeled with a reference number in FIG. 6. In forward matrix multiplication, the conduction state (i.e., the stored weights) of the RPU can be read by applying a voltage across the RPU and measuring the current that passes through the RPU.

Input voltages $V_1$, $V_2$, $V_3$ are applied to row wires 802, 804, 806, respectively. Each column wire 808, 810, 812, 814 sums the currents $I_1$, $I_2$, $I_3$, $I_4$ generated by each RPU along the particular column wire. For example, as shown in FIG. 6, the current $I_4$ generated by column wire 814 is according to the equation $I_4=V_1\sigma_{41}+V_2\sigma_{42}+V_3\sigma^{43}$. Thus, array 800 computes the forward matrix multiplication by multiplying the values stored in the RPUs by the row wire inputs, which are defined by voltages $V_1$, $V_2$, $V_3$. The backward matrix multiplication is very similar. In backward matrix multiplication, voltages are applied at column wires 808, 810, 812, 814 then read from row wires 802, 804, 806. For weight updates, which are described in greater detail below, voltages are applied to column wires and row wires at the same time, and the conductance values stored in the relevant RPU devices all update in parallel. Accordingly, the multiplication and addition operations required to perform weight updates are performed locally at each RPU 820 of array 800 using the RPU device itself plus the relevant row or column wire of array 800. Thus, in accordance with embodiments of the present invention, no read-update-write cycles are required in array 800.

Continuing with the diagram of FIG. 6, the operation of a positive weight update methodology for RPU 820 and its corresponding weight $\sigma_{43}$ at the intersection of conductive row wire 806 and conductive column wire 812 will now be provided. The non-linear characteristics of RPU 820 are used to perform multiplication operations locally at RPU 820 using stochastic computing as described below. More specifically, the described methodology uses the non-linear switching characteristics of RPU 820 and stochastic bit streams 830, 832 to perform multiplication operations and the necessary weight updates locally at RPU 820 without the necessity of other circuit elements. Update generator circuitry (not shown) is provided at the periphery of crossbar array 800 and used as a peripheral "translator" in order to generate necessary voltage pulses in the form of stochastic bit streams (e.g., 830, 832) that would be applied to all RPUs of 2D crossbar array 800 in parallel.

A row voltage sequence or bit stream 830, which is applied to row wire 806, is shown as a sequence of voltage pulses representing weight updates having a voltage of zero or a voltage of $+0.5V_{SET}$. A column voltage sequence or bit stream 832, which is applied to column wire 814, is shown as a sequence of voltage pulses also representing weight updates having either a voltage of zero or a voltage of $-0.5V_{SET}$. In example of FIG. 6, 4/8 is encoded by row voltage sequence 830, and 6/8 is encoded by column voltage sequence 832. The example voltage sequences 830, 832 represent a positive resistance change phase of the weight update. After the positive weight updates are performed, a separate set of sequences with the polarity of the respective voltages reversed can be used to update weights in a negative direction for those weights that need such correction.

Voltage sequence 834 is the voltages applied to RPU 820 resulting from the difference between row voltage sequence 830 and column voltage sequence 832. Voltage sequence 834 will have 3 voltage steps at 0V, $0.5V_{SET}$ and $V_{SET}$. When a column wire sends a voltage at $0.5V_{SET}$, and a row wire sends a voltage at $-0.5V_{SET}$, the resulting $V_{SET}$ pulse applied to the relevant RPU will cause an incremental change in the resistance of the device. Accordingly, the voltage pulses applied to RPU 820 utilize the non-linear switching characteristic of RPU 820 in order to perform a bit wise stochastic AND operation (e.g., as shown in FIG. 4) locally at RPU 820. Hence, the resulting change in the stored weight (e.g., $\sigma_{43}$) of the RPU is proportional to the product of the two numbers (4/8*6/8=3/8) "translated" by update generator circuitry, which is peripheral to crossbar array 800.

The above described crossbar arrays can include drawbacks where some undesired programming of the RPUs can occur when the RPUs are half-selected. Half-selected refers to when a $V_{SET}$ pulse is applied in the row voltage pulses but no coinciding $-V_{SET}$ pulse is present in the column voltage pulses (and vice versa).

Figure 7:
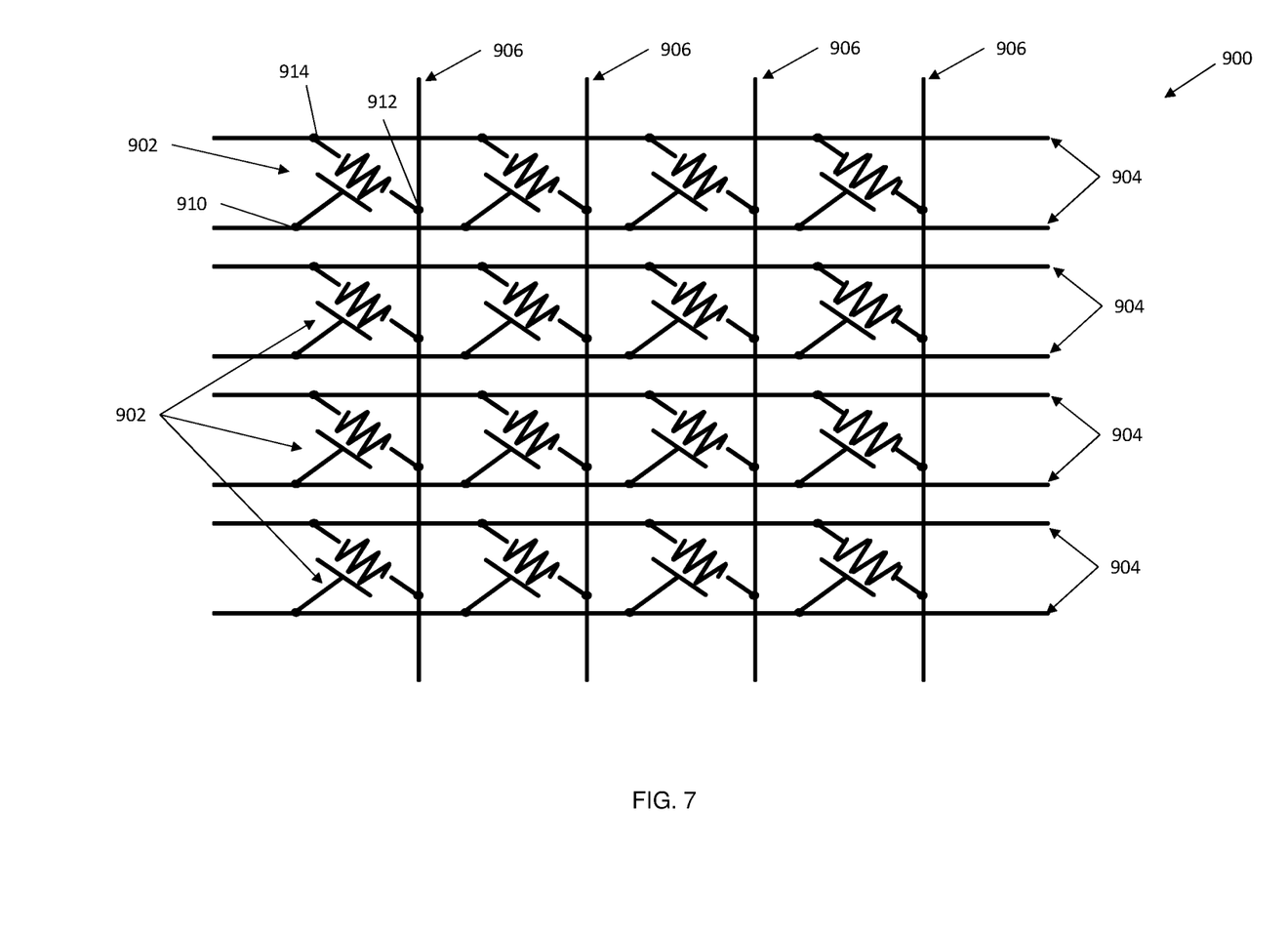
FIG. 7 depicts a cross bar array of three-terminal devices according to one or more embodiments of the present invention.

Aspects of the present invention provide for suppression of undesired programing at half-selected devices in a cross point array by utilizing 3-terminal resistive memory devices. Provided is a method that is able to suppress undesired programming at half-selected devices in crosspoint array having three-terminal resistive memory devices. In three-terminal devices, an additional gate control is utilized to provide an extra terminal that controls behavior. An update cycle for 3-terminal devices are controlled by gate-channel voltage and thus the update cycle connection can be implemented with gates (rows) and sources (columns) as shown in FIG. 7, or gates (column) and drains (rows). An example of 3-terminal crossbar array can be found in FIG. 7. The exemplary crossbar array 900 includes a set of row wires 904 and a set of column wires 906. At each intersection of the column wires 906 and row wires 904 is a three-terminal device 902. The three-terminal device 902 includes a gate terminal 910, a source terminal 912, and a drain terminal 914. In the illustrated example, the row wires 904 include two wires for each row that are attached to the gate terminal 910 and the drain terminal 914 of each three-terminal device 902. A single wire is included for each column wire 906 in the crossbar array 900 and the column wire is connected to the source terminal 912 for each three-terminal device 902. In this configuration, an update cycle occurs by utilizing similar stochastic update cycles techniques described above. Stochastic bit streams can be generated using update generator circuitry (not shown) that can be attached at the periphery of the crossbar array 900. These stochastic bit streams can be inputs to a so called "stochastic translator" in order to generate (or translate) the stochastic bit stream into corresponding voltage pulses (e.g., $V_{SET}$, $-V_{SET}$) that mimic the stochastic bit streams. These voltage are then applied to all three-terminal devices 902 of the crossbar array 900. In one or more embodiments of the invention, the sources and drains described herein are so named for ease of description. That is to say, the terms source and drain are interchangeable in the crossbar array 900.

In one or more embodiments of the present invention, the configuration of the crossbar array 900 and utilization of three-terminal devices 902 can reduce unwanted programmatic effect when the resistive memory device 902 is half selected. In the current configuration of the crossbar array 900, a voltage pulse must be present at the gate terminal 910 of three-terminal device 902 and the source terminal 912 (coincidence) for an update to the device 902 to occur. This can be achieved through the three-terminal device 902 being a single pass-gate transistor that fires when there is a voltage pulse and blocks the connection when there is no voltage pulse present. The unused terminal (drain terminal 914 in the current configuration) can be left floating during the update cycle as the potential different across gate-channel can be controlled with the gate terminal 910 and either end of the transistor channel. As mentioned above, for two-terminal devices during a stochastic update scheme, one side of the two-terminal device is connected to the crossbar rows and the other side of the two-terminal device is connected to the crossbar columns. Then, from the rows either "HIGH" or "GND" is sent while from the columns either "LOW" or "GND" is sent (e.g., "HIGH"=+1V, "GND"=0, "LOW"=−1V). In the present crossbar array 900, the three-terminal devices 902 each have gate terminals 910 and drain terminals 914 connected to the rows 904 of the crossbar array 900 and the sources terminals 912 are connected to the columns 906. During the update cycles, the drain terminals 914 are always floated ("FLT"), the gate terminals 910 are either "HIGH" or "FLT", and the source terminals 912 are either "LOW" or "FLT." For the device 902 conductance to change, current needs to flow through the gate. Because drains are always "FLT", when either source 912 or gate 910 is also "FLT", no current can pass through the devices 902. As a result, unintended modulations in the "half-selected" devices are avoided (as mentioned herein, "half-selected" refers to "HIGH-GND" or "GND-LOW" configurations in traditional stochastic update schemes.) In one or more embodiments of the present invention, the gate stacks of the devices 902 have a high impedance. Because of this high impedance, then the "floating" can still be at a relatively low enough voltage that is enough to draw current through a low impedance. This is where a high-gate impedance comes in which often includes an oxide or more in the gate stack, thus ensuring this property. In traditional two-terminal devices, current needs to pass through the channel (because there is no gate), which can have a lower impedance, in general. Therefore, in these cases, grounding the terminals that are not "HIGH" or "LOW" are required to avoid sneak paths. Because the drain terminal is always floating during the update cycle, the three-terminal device 902 is connected by the gate and source. The programming of the device 902 occurs when there is sufficient voltage drop across the gate to channel such that a current flows to tune the conductance value of the device 902.

Technical benefits of this configuration include floating the drain terminals such that the devices 902 cannot perform a sneak-path because current needs to pass two gates in order to program both devices inadvertently. The channel capacitance creates an exponential dependency between this current ($I_g$) and voltage ($V_g$) and therefore it is practically impossible to create sufficient voltage drop with floating gates. Accordingly, instead of grounding the row wires for the drain terminals 914, as performed in a regular stochastic update scheme, in some embodiments of the present invention the row wires (lines) can be left floating. By floating the lines, the method improves the update quality of the devices 902. This can occur, for example, where devices 902 are getting modified with a single pule from either gate or source. Even though such an update is much smaller than the update taken with full voltage across, a smaller update is seen for half-bias (half selected) conditions due to the non-ideal thresholding. Floating the drain terminals 914 removes these cases and the devices 902 that do not get coinciding voltage pulses remain untouched.

In other embodiments of the present invention, the crossbar array 900 can include two column wires per column and one row wire per row (not shown). With this configuration, the column wires would be connected to the gate terminal and the source terminal of the three terminal device and the row wire would be connected to the drain terminal.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments of the invention, various functions or acts can take place at a given location and/or in connection with the operation of one or more apparatuses or systems. In some embodiments of the invention, a portion of a given function or act can be performed at a first device or location, and the remainder of the function or act can be performed at one or more additional devices or locations.

The terminology used herein is for the purpose of describing particular embodiments of the invention only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. Embodiments of the present invention have been presented for purposes of illustration and description, but is not intended to be exhaustive or limited to the form described. Many modifications and variations will be apparent to those of ordinary skill in the art without departing from the scope and spirit of the embodiments of the invention. The embodiments of the invention were chosen and described in order to best explain the principles of the embodiments of the invention and the practical application, and to enable others of ordinary skill in the art to understand the embodiments of the invention.

The diagrams depicted herein are illustrative. There can be many variations to the diagram or the steps (or operations) described therein without departing from the spirit of the embodiments of the invention. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the embodiments of the invention.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment of the invention described herein as "exemplary" is not necessarily to be construed as preferred or advantageous over other embodiments of the invention. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments of the invention described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   performing, by a processor, a stochastic update for a crossbar array by generating a set of stochastic pulses, the crossbar array comprising a plurality of row wires and a plurality of column wires, the plurality of row wires comprising a first row wire and the plurality of column wires comprising a first column wire;
   wherein a three terminal device is coupled to the first row wire and the first column wire at a crosspoint of the first row wire and the first column wire;
   wherein a resistivity of the three terminal device is modified responsive to a coincidence of pulses from the set of stochastic pulses at the crosspoint of the first row and the first column; and
   wherein at least one terminal in the three terminal device is floating.

2. The computer-implemented method of claim 1, wherein the three terminal device comprises a gate terminal, a source terminal, and a drain terminal.

3. The computer-implemented method of claim 2, wherein the gate terminal is connected to the first row wire.

4. The computer-implemented method of claim 3, wherein:
   the source terminal is connected to the first column wire;
   the plurality of row wires comprises a second row wire;
   the drain terminal is connected to the second row wire; and
   the drain terminal is floating.

5. The computer-implemented method of claim 2, wherein the gate terminal is connected to the first column wire.

6. The computer-implemented method of claim 5, wherein:
   the source terminal is connected to the first row wire;
   the plurality of column wires comprises a second column wire;
   the drain terminal is connected to the second column wire; and
   the drain terminal is floating.

7. The computer-implemented method of claim 1, wherein the first three terminal device comprises a resistive processing unit.

8. A system comprising:
   a memory having computer readable instructions; and
   one or more processors for executing the computer readable instructions, the computer readable instructions controlling the one or more processors to perform operations comprising:
   performing a stochastic update for a crossbar array by generating a set of stochastic pulses, the crossbar array comprising a plurality of row wires and a plurality of column wires, the plurality of row wires comprising a first row wire and the plurality of column wires comprising a first column wire;
   wherein a three terminal device is coupled to the first row wire and the first column wire at a crosspoint of the first row wire and the first column wire;
   wherein a resistivity of the three terminal device is modified responsive to a coincidence of pulses from the set of stochastic pulses at the crosspoint of the first row and the first column; and
   wherein at least one terminal in the three terminal device is floating.

9. The system of claim 8, wherein the three terminal device comprises a gate terminal, a source terminal, and a drain terminal.

10. The system of claim 9, wherein the gate terminal is connected to the first row wire.

11. The system of claim 10, wherein:
   the source terminal is connected to the first column wire;
   the plurality of row wires comprises a second row wire;

the drain terminal is connected to the second row wire; and the drain terminal is floating.

12. The system of claim 9, wherein the gate terminal is connected to the first column wire.

13. The system of claim 12, wherein:

the source terminal is connected to the first row wire;

the plurality of column wires comprises a second column wire;

the drain terminal is connected to the second column wire; and the drain terminal is floating.

14. The system of claim 8, wherein the first three terminal device comprises a resistive processing unit.

15. A computer program product comprising a computer readable storage medium having program instructions embodied therewith, the program instructions executable by a processor to cause the processor to perform operations comprising:

performing, by the processor, a stochastic update for a crossbar array by generating a set of stochastic pulses, the crossbar array comprising a plurality of row wires and a plurality of column wires, the plurality of row wires comprising a first row wire and the plurality of column wires comprising a first column wire;

wherein a three terminal device is coupled to the first row wire and the first column wire at a crosspoint of the first row wire and the first column wire; and wherein a resistivity of the three terminal device is modified responsive to a coincidence of pulses from the set of stochastic pulses at the crosspoint of the first row and the first column; and wherein at least one terminal in the three terminal device is floating.

16. The computer program product of claim 15, wherein the three terminal device comprises a gate terminal, a source terminal, and a drain terminal.

17. The computer program product of claim 16, wherein the gate terminal is connected to the first row wire.

18. The computer program product of claim 17, wherein:

the source terminal is connected to the first column wire;

the plurality of row wires comprises a second row wire;

the drain terminal is connected to the second row wire; and the drain terminal is floating.

19. The computer program product of claim 16, wherein the gate terminal is connected to the first column wire.

20. The computer program product of claim 19, wherein:

the source terminal is connected to the first row wire;

the plurality of column wires comprises a second column wire;

the drain terminal is connected to the second column wire; and the drain terminal is floating.

* * * * *